(12) United States Patent
Okuda et al.

(10) Patent No.: US 7,950,145 B2
(45) Date of Patent: May 31, 2011

(54) COMPONENT MOUNTING APPARATUS AND METHOD FOR DETERMINING COMPONENT HOLDING MEMBERS

(75) Inventors: Osamu Okuda, Fukuoka (JP); Takeyuki Kawase, Saga (JP)

(73) Assignee: Panasonic Corporation, Osaka (JP)

( * ) Notice: Subject to any disclaimer, the term of this patent is extended or adjusted under 35 U.S.C. 154(b) by 259 days.

(21) Appl. No.: 11/792,920

(22) PCT Filed: Feb. 21, 2006

(86) PCT No.: PCT/JP2006/303522
§ 371 (c)(1),
(2), (4) Date: Jun. 13, 2007

(87) PCT Pub. No.: WO2006/090867
PCT Pub. Date: Aug. 31, 2006

(65) Prior Publication Data
US 2008/0005894 A1    Jan. 10, 2008

(30) Foreign Application Priority Data

Feb. 22, 2005   (JP) .................................. 2005-045173

(51) Int. Cl.
*H05K 3/30*   (2006.01)
(52) U.S. Cl. ............................. 29/834; 29/832; 29/833
(58) Field of Classification Search ............... 29/834, 29/832–833, 837
See application file for complete search history.

(56) References Cited

U.S. PATENT DOCUMENTS

| 7,020,953 B2 * | 4/2006 | Ueno et al. ................. 29/740 |
| 2002/0073536 A1 * | 6/2002 | Okuda et al. ............... 29/740 |

FOREIGN PATENT DOCUMENTS

| JP | 10-70395 | 3/1998 |
| JP | 2006-210705 | 8/2006 |

OTHER PUBLICATIONS

Patent Cooperation Treaty (PCT) International Preliminary Report on Patentability, issued on Aug. 28, 2007 in International Application No. PCT/JP2006/303522.

* cited by examiner

*Primary Examiner* — A. Dexter Tugbang
*Assistant Examiner* — David P Angwin
(74) *Attorney, Agent, or Firm* — Wenderoth, Lind & Ponack, L.L.P.

(57) ABSTRACT

For determining the types of component holding members equipped to a plurality of holding-member equipping sections, a detection sensor having a detection optical axis in a direction intersecting with the arrayed direction of the respective holding-member equipping sections is used, and the respective holding-member equipping sections have a first detection position where interrupting of the detection optical axis is detectable only when a second component holding member is equipped and a second detection position where interrupting of the detection optical axis is detectable when the component holding member of any type is equipped. Consequently, by sequentially positioning the detection optical axis at the respective detection positions and detecting the presence of interrupting, the type of the equipped component holding member is determined only by the detection sensor.

7 Claims, 10 Drawing Sheets

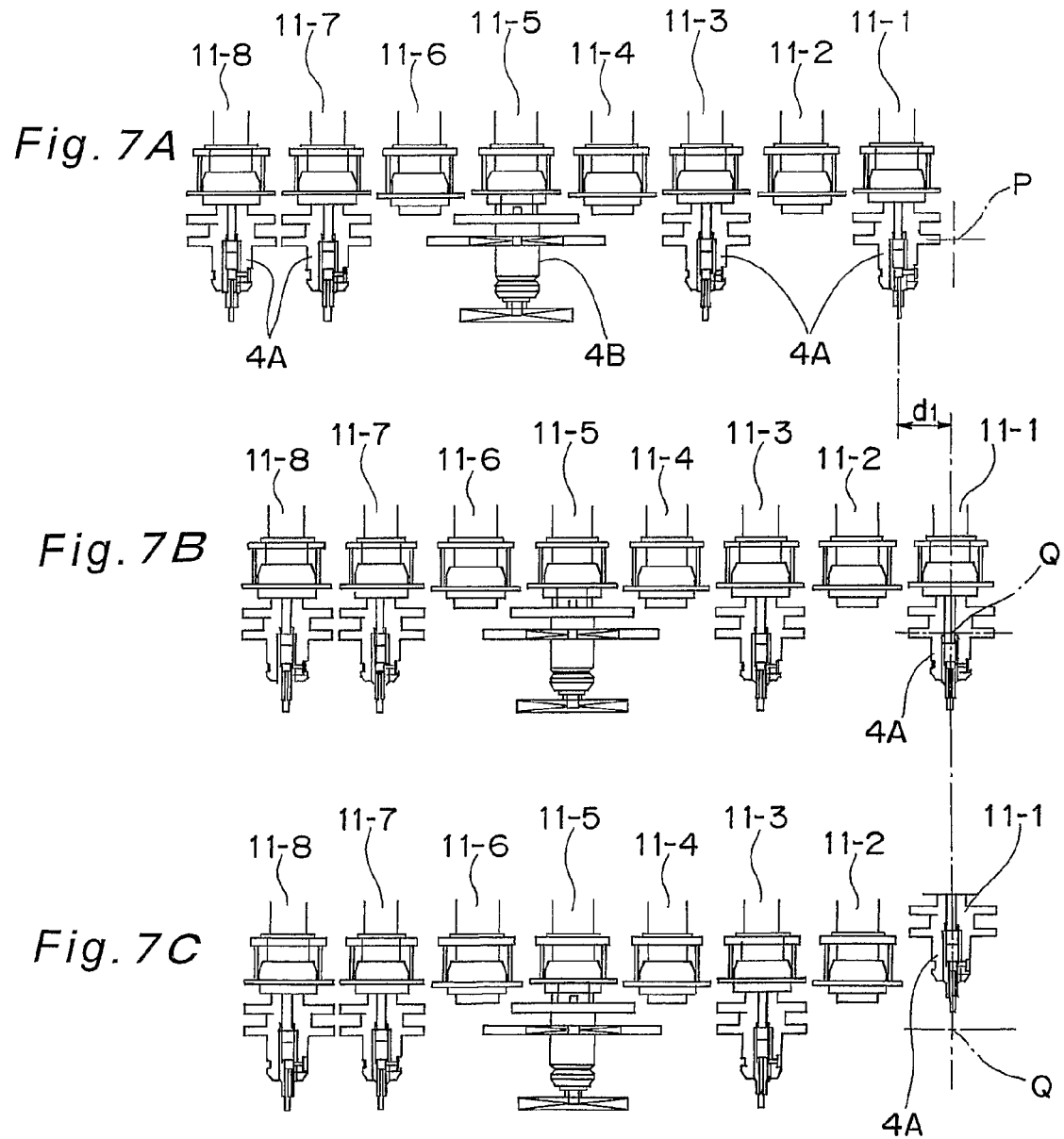

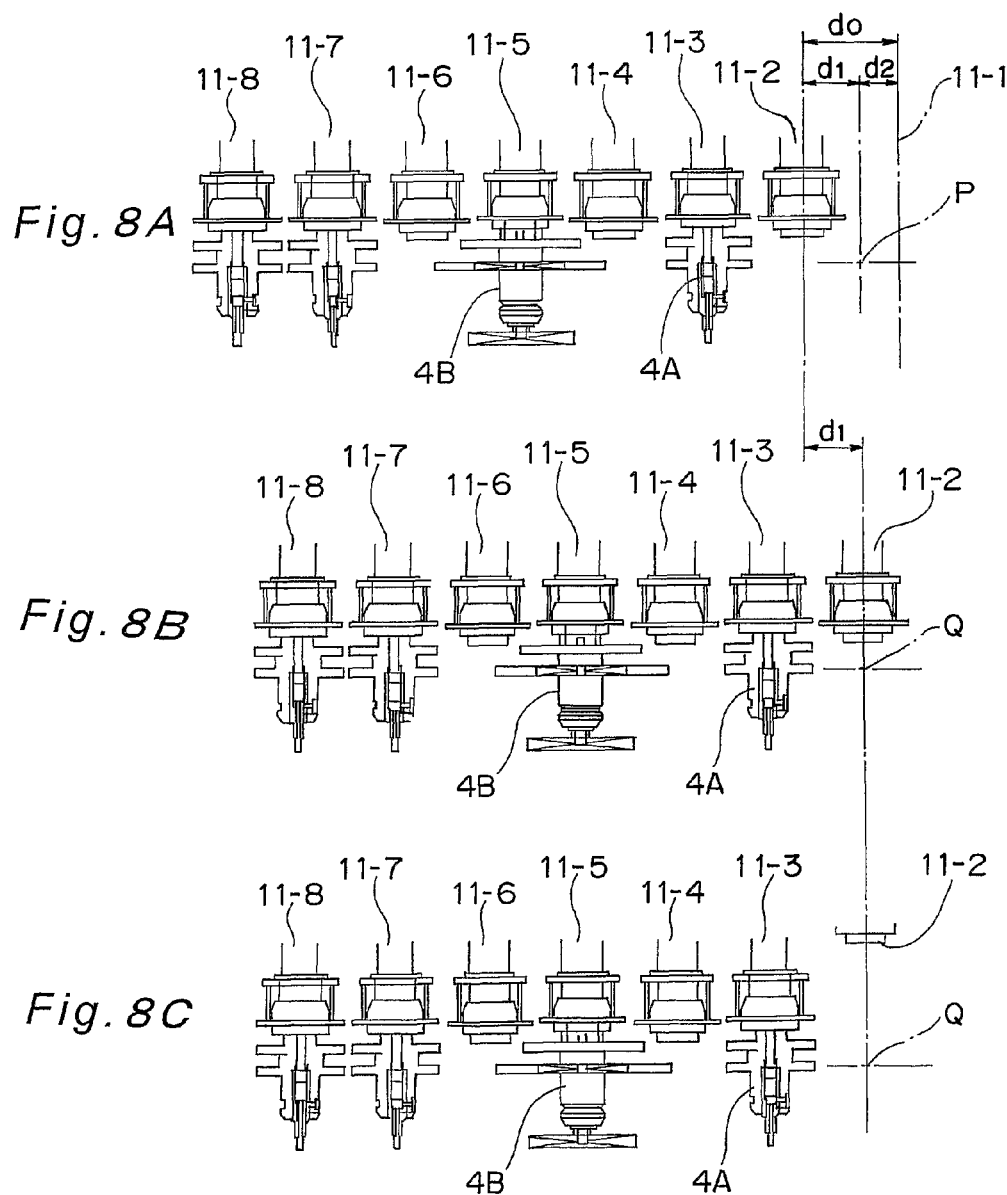

COMPONENT MOUNTING APPARATUS AND METHOD FOR DETERMINING COMPONENT HOLDING MEMBERS

TECHNICAL FIELD

The present invention relates to a component mounting apparatus and a method for determining component holding members, for use in component mounting operation for holding a component by the component holding member equipped to a component mounting head and mounting the component on a circuit board, for determining a type of the component holding members replaceably equipped to the component mounting head.

BACKGROUND ART

As the method for determining the type of component holding members, i.e., suction nozzles, equipped to the component mounting head and the component mounting apparatus for performing the determination method, various methods and apparatuses have conventionally been known (see, e.g., Japanese Patent Publication No. H10-70395 A). FIG. 10 is a schematic perspective view showing the structure of a component mounting apparatus 500 as an example of such conventional component mounting apparatuses.

As shown in FIG. 10, in the component mounting apparatus 500, nozzle holders 516, 517 which can detachably be equipped with a suction nozzle 519 for sucking and holding a component 505 are installed on a head 503 equipped to an XY robot 508. A plurality of types of suction nozzles 519 appropriate for sucking a plurality of types of the components which should be mounted on a circuit board 502 are housed in specified positions in respective nozzle stations 506, and based on a control program of the apparatus, the XY robot 508 selects suction nozzles 519 appropriate for sucking the components from the nozzle stations 506 and makes the suction nozzles 519 be equipped to the nozzle holders 516, 517. With the selected suction nozzle 519, the component 505 is sucked and held from a component feeding section 514, and the sucked and held component 505 is mounted in a specified position on the circuit board 502.

Moreover in FIG. 10, a component waste box container 504 is disposed on an apparatus base below the head 503, and a pair of transmission sensors 520 is disposed on the lateral face of the component waste box container 504 for determining the presence of the equipping of the suction nozzle 519 to the nozzle holder 516 or 517 by using the mechanism that the equipped suction nozzle 519 interrupts an optical axis when the nozzle holder is lowered. The respective suction nozzles 519 have nozzle identifying marks 522 different from each other, and these nozzle identifying marks 522 are identified by a nozzle identifying sensor 521. It is to be noted that the optical axis of the transmission sensors 520 is disposed along a direction along which the respective nozzle holders 516, 517 of the head 503 are placed.

A description is given of an operation to determine the presence of the equipping and the type of suction nozzles by the transmission sensors 520 and the nozzle identifying sensor 521. First, the head 503 is moved so as to be located above the component waste box container 504 by the XY robot 508, and the respective suction nozzles 519 are aligned along and above the optical axis of the transmission sensors 520. Then, the transmission sensors 520 confirm the presence of the equipping of each of the suction nozzles 519 to the head 503. More specifically, the nozzle holder 516 is lowered so as to be positioned at a position where the optical axis can be interrupted when the suction nozzle 519 is equipped, and the presence of interrupting of the optical axis is confirmed. The same operation is applied to the nozzle holder 517. Along with this operation, the nozzle identifying sensor 521 reads the nozzle identifying mark 522 put on the equipped suction nozzle 519 for determining the type of the equipped suction nozzle 519. This makes it possible to determine the presence of the equipping of a suction nozzle 519 and the type of the equipped suction nozzle 519.

SUMMARY OF INVENTION

In recent years, most component mounting apparatuses have been employing the structure in which suction nozzles are arranged in a line on the head. Moreover, in most apparatuses, the types of components which can be sucked and held by one type of suction nozzle are increasing in a range, and two types of suctions nozzles, a large-nozzle for sucking and holding relatively large-size components and a small-nozzle for sucking and holding standard-size to relatively small-size components, are mainly being used as the suction nozzles selectively replaced and equipped to the head.

However, in the conventional component mounting apparatus 500, for determining the type of the equipped suction nozzle 519, the nozzle identifying marks 522 put on the respective suction nozzles 519 are respectively read by the nozzle identifying sensor 521 provided separately from the transmission sensors 520, and the type of the suction nozzle 519 is determined based on the readout result. In the case where the suction nozzles 519 replaced and equipped to the head 503 are present in a large number, such a determination method is acceptable. However, in the structure involving suction nozzles of only large and small two types, which are becoming the dominant form in recent years, providing such a nozzle identifying sensor 521 causes a problem that waste in terms of apparatus costs became large.

Moreover, the optical axis of the transmission sensors 520 for confirming the presence of the equipping of the suction nozzle 519 to the nozzle holder 516 or 517 is disposed along placement direction of the suction nozzle 519 in the head 503, and therefore as the number of the equipped suction nozzles 519 increase to, for example, 6 to 10, the optical axis direction becomes longer, which increases operation steps necessary in adjustment operation such as alignment of the optical axes of two sensors and thereby causes a problem of deteriorated productivity in component mounting.

Moreover, employing such structure as having two types of sensor such as the transmission sensors 520 and the nozzle identifying sensor 521 for determining the presence of the equipping of such a suction nozzle 519 and the type of the suction nozzle 519 disturbs achievement of reduction in apparatus cost in the component mounting apparatus 500.

An object of the present invention is to provide, for solving these problems, a component mounting apparatus and a method for determining component holding members, for use in component mounting operation for holding a component by a component holding member equipped to a component mounting head and mounting the component on a circuit board, which allow efficient determination of the type of the component holding members replaceably equipped to the component mounting head and which allow reduction in apparatus cost for the determination operation.

In accomplishing these and other aspects, the present invention is structured as shown below.

According to a first aspect of the present invention, there is provided a component mounting apparatus, comprising:

a component mounting head having holding-member equipping sections, which are arrayed in a line and to which a first component holding member for holding a component or a second component holding member having a shape different from the first component holding member is replaceably and selectively equipped, for holding the component by the first or second component holding member selectively equipped to the respective holding-member equipping sections and mounting the component on a circuit board;

a head moving device for moving the component mounting head in a direction along a surface of the circuit board, and a detection sensor having a detection optical axis disposed in a direction intersecting with an arrayed direction of the respective holding-member equipping sections, for detecting presence of interrupting of the detection optical axis by the component holding member selectively equipped to the component mounting head, wherein the respective holding-member equipping sections has a first detection position where interrupting of the detection optical axis by the first component holding member is not detected by the detection sensor with the first component holding member being equipped and where interrupting of the detection optical axis by the second component holding member is detected with the second component holding member being equipped, and a second detection position where interrupting of the detection optical axis of the detection sensor by the component holding member is detected with either of the first or second component holding member being equipped, and the component mounting apparatus further includes a control unit for performing a movement control of the component mounting head by the head moving device so as to position the detection optical axis of the detection sensor at the first detection position and the second detection position in the respective holding-member equipping sections and for determining presence of selective equipping of the first component holding member or the second component holding member to the respective holding-member equipping sections on a basis of a detection result by the detection sensor at the first detection position or at the first and second detection positions.

According to a second aspect of the present invention, there is provided the component mounting apparatus as defined in the first aspect, wherein the detection optical axis of the detection sensor is disposed in a direction orthogonal to the arrayed direction of the respective holding-member equipping sections and almost along the surface of the circuit board, and in the respective holding-member equipping sections, the respective first and second detection positions are located at an identical height position.

According to a third aspect of the present invention, there is provided the component mounting apparatus as defined in the second aspect, wherein in the respective holding-member equipping sections, the second detection position is a position on a center of an axis of the component holding member equipped to the holding-member equipping section, and the first detection position is located in a position away from the second detection position in one direction along the arrayed direction of the respective holding-member equipping sections, the position being outside from an outer edge of the first component holding member in a state of being equipped to the holding-member equipping section and being inside from an outer edge of the second component holding member in a state of being equipped to the holding-member equipping section.

According to a fourth aspect of the present invention, there is provided the component mounting apparatus as defined in the second aspect, wherein the control unit is operable to control movement of the component mounting head by the head moving device in one direction along the arrayed direction of the respective holding-member equipping sections so as to sequentially position the respective first and second detection positions in the component mounting head on the detection optical axis of the detection sensor.

According to a fifth aspect of the present invention, there is provided the component mounting apparatus as defined in the second aspect, wherein the component mounting head further has a lifting and lowering device for separately lifting and lowering the respective holding-member equipping sections, and the control unit is operable to control the lifting and lowering device so as to lift the holding-member equipping section with detection of presence of interrupting of the detection optical axis at the first detection position or the second detection position for determining a type of the selectively equipped component holding member being completed.

According to a sixth aspect of the present invention, there is provided the component mounting apparatus as defined in the fifth aspect, wherein in the component mounting head, the respective holding-member equipping sections are arrayed at constant intervals, and the respective first component holding members have a dimensional shape that the constant intervals are used as equipping intervals in equipping to the holding-member equipping sections, while the respective second component holding members have a dimensional shape that double the constant intervals are used as equipping intervals in equipping to the holding-member equipping sections.

According to a seventh aspect of the present invention, there is provided the component mounting apparatus as defined in the fifth aspect, wherein in a case that the control unit determines that the second component holding member is equipped to one holding-member equipping section on a basis of the detection result by the detection sensor, the control unit is operable to control the lifting and lowering device so as to lift the holding-member equipping section adjacent to the one holding-member equipping section together with the one holding-member equipping section.

According to an eighth aspect of the present invention, there is provided the component mounting apparatus as defined in the first aspect to the seventh aspect, wherein the control unit collates information of determination results about presence of selective equipping of the respective component holding members with preset selective equipping information about the respective component holding members, and in a case that both of the information are matched, the control unit makes the component mounting head in a state possible to start a component mounting operation.

According to a ninth aspect of the present invention, there is provided a method for determining component holding members, for use in a component mounting head having holding-member equipping sections, which are arrayed in a line and to which a first component holding member for holding a component or a second component holding member having a shape different from the first component holding member is replaceably and selectively equipped, for holding the component by the first or second component holding member selectively equipped to the respective holding-member equipping sections and mounting the component on a circuit board, for determining presence of selective equipping of the first or second component holding members to the respective holding-member equipping sections, comprising:

in a state that a detection sensor having a detection optical axis disposed in a direction intersecting with an arrayed direction of the respective holding-member equipping sections for detecting presence of interrupting of the detection optical axis by the component holding member selectively equipped to the component mounting head, in the respective holding-member equipping sections having a first detection position where interrupting of the detection optical axis by the first component holding member is not detected by the detection sensor with the first component holding member being equipped and where interrupting of the detection optical axis by the second component holding member is detected with the second component holding member being equipped, and a second detection position where interrupting of the detection optical axis of the detection sensor by the component holding member is detected with either component holding member being equipped, detecting presence of interrupting of the optical axis due to the component holding member by positioning the detection optical axis at the first detection position or at the first and second detection position; and determining presence of selective equipping of the first or second component holding members to the respective holding-member equipping sections on a basis of a detection result at the first detection position or at the first and second detection positions.

According to a tenth aspect of the present invention, there is provided the method for determining component holding members as defined in the ninth aspect, wherein in detecting presence of interrupting of the optical axis, presence of interrupting of the detection optical axis is detected by positioning the detection optical axis at the first detection position, in the respective holding-member equipping sections, and then if the interrupting is detected at the first detection position, it is determined on a basis of the detection result that the second component holding member is equipped to the holding-member equipping section.

According to an eleventh aspect of the present invention, there is provided the method for determining component holding members as defined in the tenth aspect, wherein in detecting presence of interrupting of the optical axis, if interrupting of the detection optical axis is not detected at the first detection position, then the detection optical axis is positioned at the second detection position to detect presence of interrupting of the detection optical axis, in the respective holding-member equipping sections, and if the interrupting is detected at the second detection position, then it is determined on a basis of the detection result that the first component holding member is equipped to the holding-member equipping section.

According to a twelfth aspect of the present invention, there is provided the method for determining component holding members as defined in the eleventh aspect, wherein if the interrupting is not detected at the second detection position, then it is determined based on the detection result that the first and second component holding member are not equipped to the holding-member equipping section.

According to a thirteenth aspect of the present invention, there is provided the method for determining component holding members as defined in the ninth aspect, wherein after completion of detecting presence of interrupting of the detection optical axis at the first position or the first and second positions for determination of the selectively equipped component holding member in the respective holding-member equipping sections, the holding-member equipping section is lifted.

According to a fourteenth aspect of the present invention, there is provided the method for determining component holding members as defined in the thirteenth aspect, wherein in the component mounting head in which the respective holding-member equipping sections are arrayed at constant intervals, and the respective first component holding members have a dimensional shape that the constant intervals are used as equipping intervals in equipping to the holding-member equipping sections, while the respective second component holding members have a dimensional shape that double the constant intervals are used as equipping intervals in equipping to the holding-member equipping sections, in determining presence of interrupting, if it is determined on a basis of a detection result by the detection sensor that the second component holding member is equipped to one holding-member equipping section, then the holding-member equipping section adjacent to the one holding-member equipping section is lifted together with the one holding-member equipping section.

According to the present invention, for determining the types of component holding members equipped to a plurality of holding-member equipping sections included in the component mounting head, a detection sensor having a detection optical axis in a direction intersecting with the arrayed direction of the respective holding-member equipping sections is used, and the respective holding-member equipping sections have a first detection position where interrupting of the detection optical axis is detectable only when the second component holding member is equipped and a second detection position where interrupting of the detection optical axis is detectable when the component holding member of any type is equipped, so that by sequentially positioning the detection optical axis at the respective detection positions and detecting the presence of interrupting of the detection optical axis, the presence of the equipping of the component holding member and the type of the equipped component holding member can be determined only by one sensor, i.e., the detection sensor. Therefore, it becomes possible to reduce costs for installing and maintaining a sensor for checking such component holding members, and to reduce equipment cost in the component mounting apparatus.

Particularly, it becomes possible to eliminate the necessity of providing conventionally used sophisticated identifying sensors, i.e., sophisticated identifying sensors for reading and recognizing the identifying marks separately put on the respective component holding members in order to determine the types of the component holding members, and therefore the determination can be achieved simply by a pair of, for example, transmission sensors. Moreover, since the detection optical axis disposed between a pair of the transmission sensors is disposed in a direction orthogonal to the arrayed direction of the respective holding-member equipping sections, increase in a distance of the optical axis as seen in the conventional structure can be prevented and its adjustment operation can be facilitated.

Moreover, since the respective first detection position and second detection position are located at the identical height position, intermittently moving the component mounting head in one direction by the moving device during detection processing of the component holding member makes it possible to sequentially position the respective detection positions on the detection optical axis. This can make the detection processing efficient.

Moreover, the holding-member equipping sections with detection processing of the component holding members being completed are controlled to be sequentially lifted, so that the detection sensor can be located at the height position which prevents the detection sensor from protruding from the apparatus base. This makes it possible to reliably prevent interference of the component holding members and the holding-member equipping sections with the determination being completed with other component members of the apparatus, and to reliably prevent generation of errors during the detection processing, thereby allowing implementation of efficient detection processing.

Moreover, in the case where it is determined that the second component holding member is equipped to the holding-member equipping section, the holding-member equipping section with the second component holding member equipped thereto is lifted together with an adjacent next holding-member equipping section, so that it is possible to determine that the component holding member is not equipped to the next holding-member equipping section without execution of the detection processing, which makes it possible to curtail a time necessary for the detection processing and to provide more efficient processing.

BRIEF DESCRIPTION OF DRAWINGS

These and other aspects and features of the present invention will become clear from the following description taken in conjunction with the preferred embodiments thereof with reference to the accompanying drawings, in which:

FIG. 7A to FIG. 7C are schematic explanatory views for explaining the procedures of the suction nozzle checking process in the flowchart in FIG. 6, in which:

FIG. 7A is a view showing a detection optical axis being at a large-nozzle detection position in a first nozzle holder;

FIG. 7B is a view showing a detection optical axis being at a small-nozzle detection position in the first nozzle holder; and FIG. 7C is a view showing the first nozzle holder in the state of being lifted;

FIG. 8A to FIG. 8C are schematic explanatory views for explaining the procedures of the suction nozzle checking process in the flowchart in FIG. 6, in which:

FIG. 8A is a view showing a detection optical axis being at a large-nozzle detection position in a second nozzle holder;

FIG. 8B is a view showing a detection optical axis being at a small-nozzle detection position in the second nozzle holder; and FIG. 8C is a view showing the second nozzle holder in the state of being lifted;

FIG. 9A and FIG. 9B are schematic views for explaining the procedures of the suction nozzle checking process in the flowchart in FIG. 6, in which:

FIG. 9A is a view showing a detection optical axis being at a large-nozzle detection position in a fifth nozzle holder; and FIG. 9B is a view showing the fifth nozzle holder holding the large-nozzle in the state of being lifted together with a sixth nozzle holder.

DETAILED DESCRIPTION OF THE INVENTION

Figure 1:
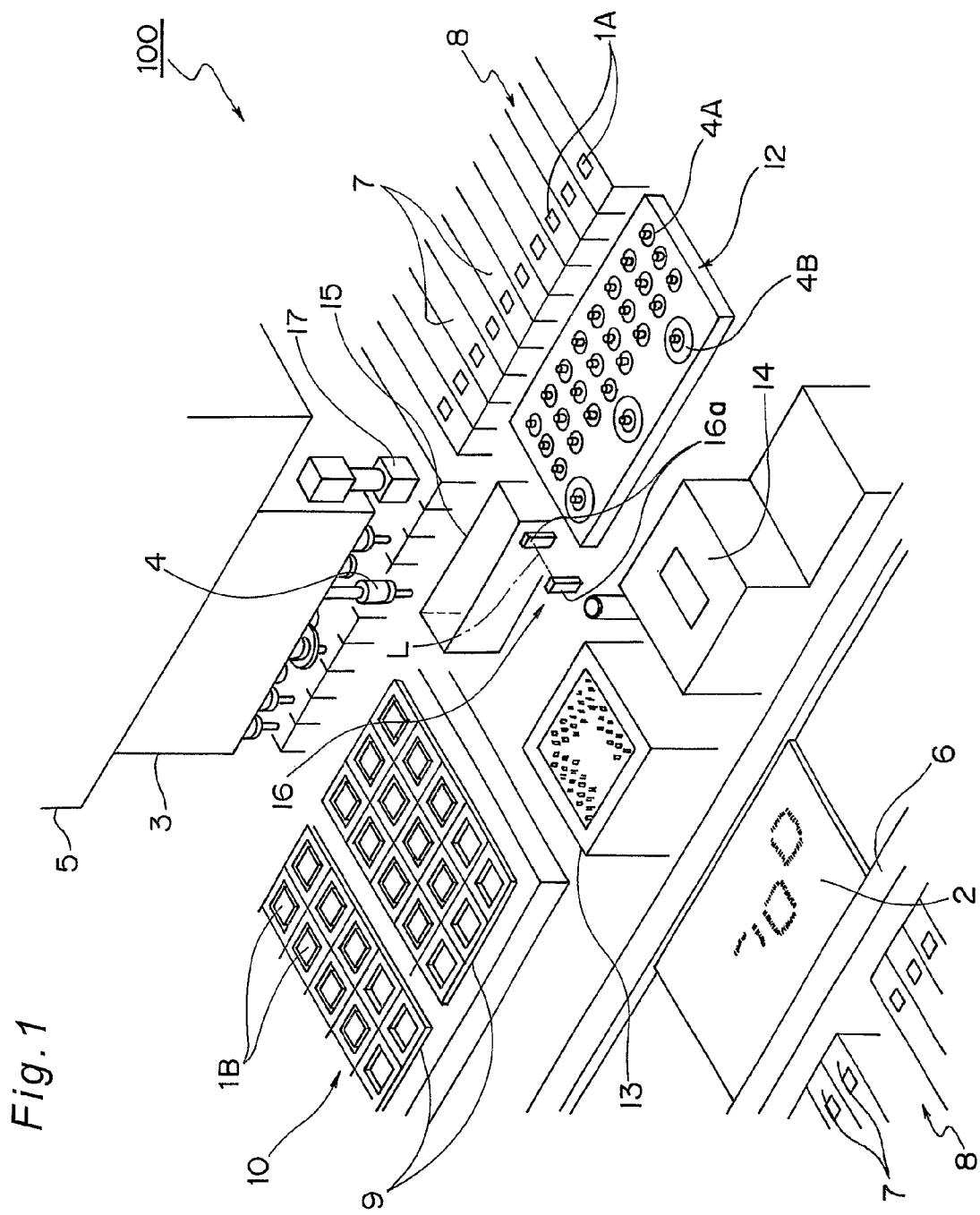
FIG. 1 is a schematic perspective view showing the structure of a component mounting apparatus according to one embodiment of the present invention.

Before the description of the present invention proceeds, it is to be noted that like parts are designated by like reference numerals throughout the accompanying drawings.

Hereinbelow, one embodiment of the present invention is described in detail with reference to the accompanying drawings.

A schematic perspective view showing a schematic structure of a component mounting apparatus 100 according to one embodiment of the present invention is shown in FIG. 1. As shown in FIG. 1, the component mounting apparatus 100 includes a head 3 exemplifying a component mounting head to which a plurality of suction nozzles 4 exemplifying component holding members sucking and holding components 1 are equipped, and an XY robot 5 exemplifying a head moving device for supporting the head 3 and moving the head 3 in an X axis direction or Y axis direction which are directions orthogonal to each other almost along the surface of a circuit board 2 as viewed in the drawing. On an apparatus base of the component mounting apparatus 100, a board stage 6 onto which the circuit board 2 with the components 1 mounted thereon are transported and disposed, and two types of component feed units for feeding components different from each other as the components 1 to be mounted on the circuit board 2 are provided.

More specifically, the component mounting apparatus 100 includes a plurality of arrayed parts cassettes 7 for housing a plurality of chip components 1A exemplifying the first components with use of taping members, a taping component feed unit 8 for feeding the chip components 1A housed in the taping members from the respective parts cassettes 7, and a tray component feed unit 10 for feeding IC chips 1B exemplifying the second components different from the first components from a component feed tray 9 in which a plurality of arrayed IC chips 1B are placed. It is to be noted that examples of the chip components 1A include such components as resistors and capacitors, which have a characteristic of being smaller in outer shape than the IC chips 1B.

For credibly sucking and holding such respective components 1 different in outer shape from each other, the component mounting apparatus 100 includes a small-size suction nozzle 4A (hereinbelow referred to as a small-nozzle 4A) serving as the first component holding member for sucking and holding the chip components 1A which are relatively small-size components, and a large-size suction nozzle 4B (hereinbelow referred to as a large-nozzle 4B) serving as the second component holding member for sucking and holding the IC chips 1B which are relatively large-size components.

Figure 2:
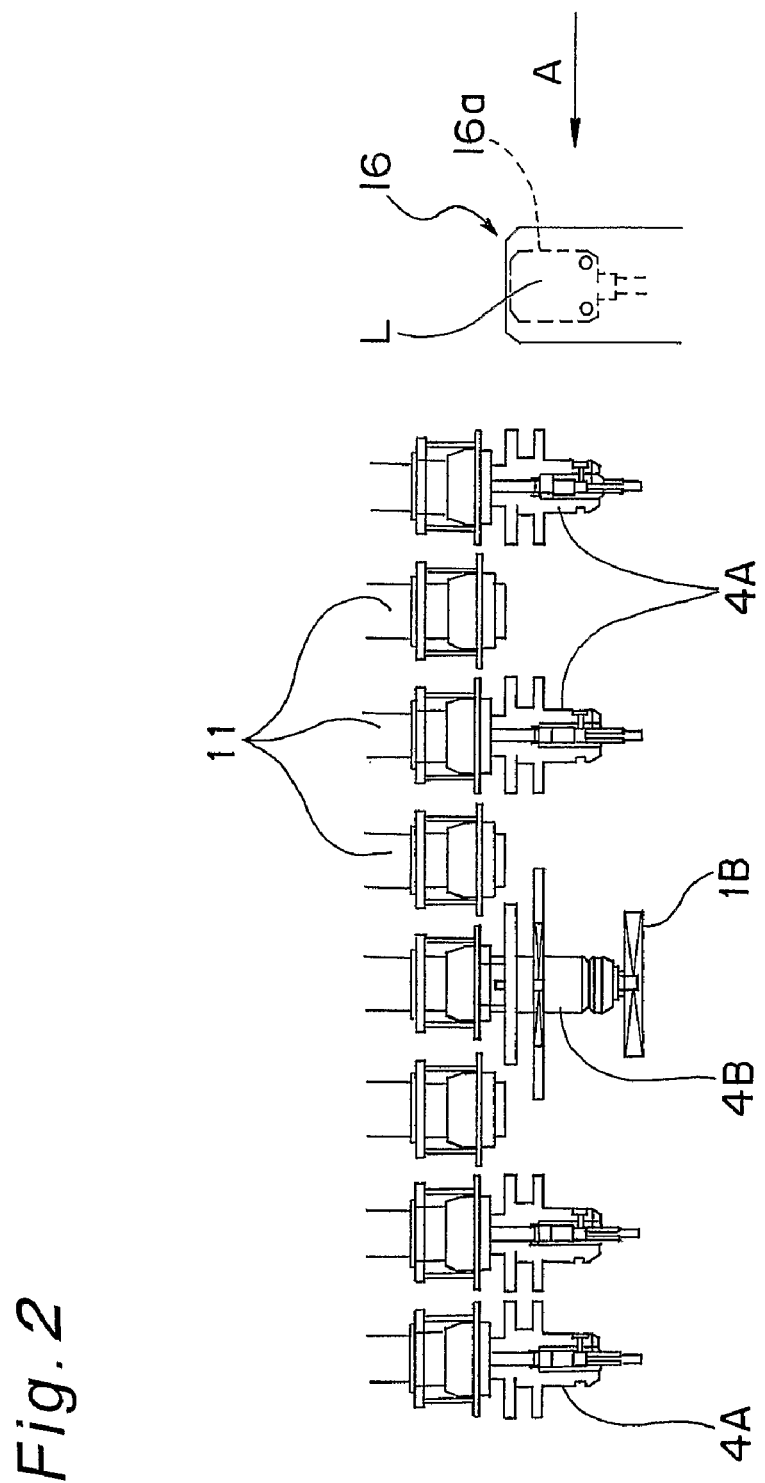
FIG. 2 is a side view showing a nozzle holder and a nozzle detection sensor included in the component mounting apparatus in FIG. 1.

Herein, FIG. 2 shows an enlarged schematic view of a portion of the head 3 to which the respective suction nozzles 4 are equipped. As shown in FIG. 2, on the lower face of the head 3, a plurality of nozzle holders 11, e.g., eight nozzle holders 11, exemplifying a holding-member equipping sections to which the suction nozzles 4 are detachably equipped are arrayed in a line at a constant interval pitch. To these nozzle holders 11, the small-nozzle 4A and the large-nozzle 4B can be selectively equipped. For example, in FIG. 2, the small-nozzle 4A is selectively equipped to the nozzle holder 11 positioned on the left end side, and the large-nozzle 4B is selectively equipped to the fourth nozzle holder 11 from the left side. Further, no suction nozzle 4 is equipped to the second nozzle holder 11 from the left side. It is to be noted that in the head 3, the nozzle holders 11 each have a lifting and lowering device (unshown) for their independent lifting and lowering operation, and lifting and lowering the nozzle holders 11 by their own lifting and lowering devices makes it possible to perform lifting and lowering operation of the suction nozzles 4 equipped to the respective nozzle holders 11.

Moreover, as shown in FIG. 2, since the large-nozzle 4B is formed to have an outer shape larger than the small-nozzle 4A, it is possible to equip the small-nozzle 4A to the nozzle holders 11 adjacent to each other whereas it is not possible to equip the large-nozzle 4B to the nozzle holders 11 adjacent to each other. More particularly, in the head 3, the smallest equipping interval pitch of the respective small-nozzles 4A is equal to the interval pitch of the respective nozzle holders 11, whereas the smallest equipping interval pitch of the respective large-nozzle 4B is double the interval pitch of the respective nozzle holders 11. Therefore, as shown in FIG. 2, no suction nozzle 4 is equipped to the adjacent nozzle holders 11 on both the sides of the nozzle holder 11 to which the large-nozzle 4B is equipped.

Moreover, as shown in FIG. 1, a nozzle changing section 12 for housing a plurality of small-nozzles 4A and large-nozzles 4B replaceably equipped to the respective nozzle holders 11 of the head 3 is provided on the apparatus base of the component mounting apparatus 100. As recognition cameras for recognizing components held by the suction nozzles 4, a two-dimensional camera 13 for mainly recognizing the chip components 1A and a three-dimensional camera 14 for mainly recognizing the IC chips 1B are further provided on the apparatus base. Recognizing the sucked and held posture of the b1 by such recognition cameras makes it possible to perform mounting operation of the component 1 on the circuit board 2 while correcting the sucked and held posture of the component.

Figure 3:
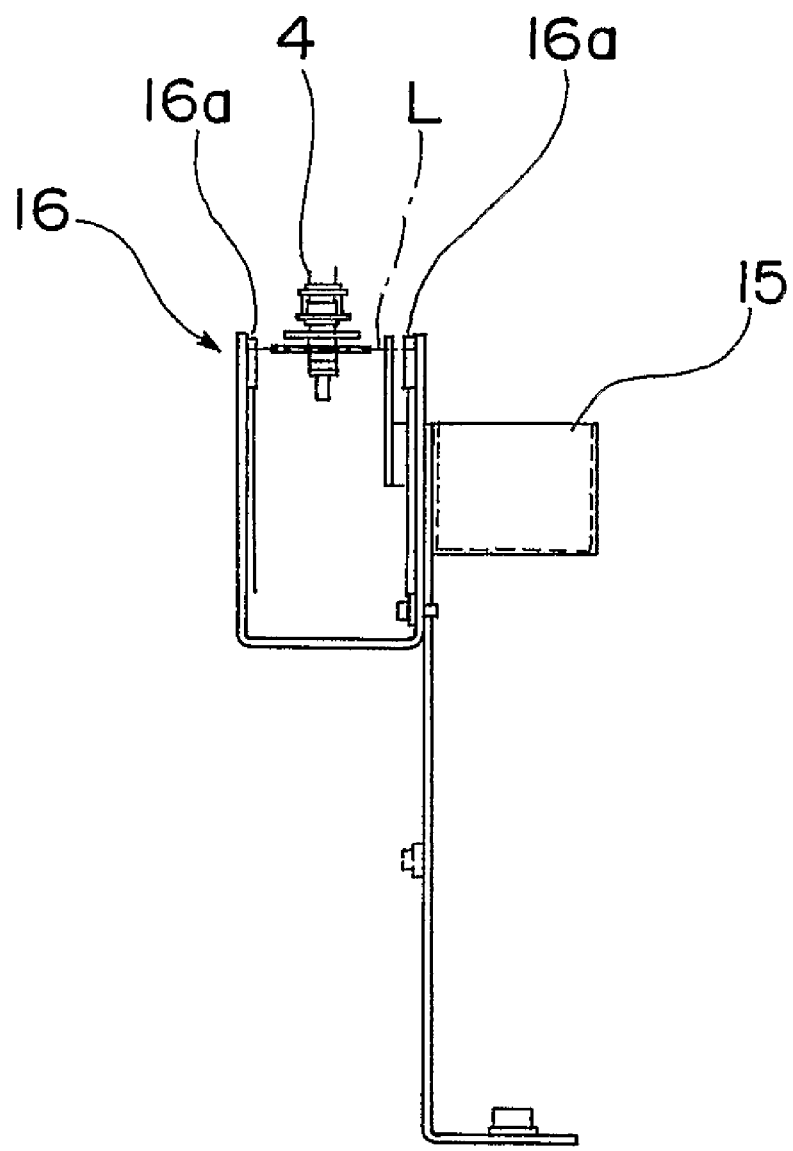
FIG. 3 is a cross sectional view seen from 'A' direction of the nozzle detection sensor in FIG. 2.

A waste box 15 for discarding faulty components in the state of being sucked and held by the suction nozzles 4 is further provided on the apparatus base of the component mounting apparatus 100. A nozzle detection sensor 16, which has a pair of transmission sensors 16a for emitting and receiving light on its linearly disposed detection optical axis L and for detecting the presence of an object on the detection optical axis L by detecting the presence of interrupting of the detection optical axis L (i.e., the state that the emitted light cannot be received), is provided on a lateral side of the waste box 15. Herein, a cross sectional view of the nozzle detection sensor 16 disposed on the right-hand side in FIG. 2 seen from an arrow 'A' direction is shown in FIG. 3. As shown in FIG. 3, the nozzle detection sensor 16 has a detection optical axis L disposed in a direction orthogonal to the arrayed direction of the respective nozzle holder 11 in the head 3 in a direction almost along the surface of the circuit board. The suction nozzle 4 disposed between such a pair of transmission sensors 16a physically interrupts the detection optical axis L, by which the nozzle detection sensor 16 determines the presence of the equipping of the suction nozzle 4 to the nozzle holder 11 as the object, and the nozzle detection sensor 16 further has a function to determine the type of the equipped suction nozzle 4 by a later-described method. It is to be noted that the disposing direction of such a detection optical axis L is not limited to the direction described, and other directions are acceptable as long as the detection optical axis L is disposed in a direction intersecting with the arrayed direction of the respective nozzle holder 11. However, in consideration of a later-described detection method employed for the suction nozzle 4, it is preferable to dispose the detection optical axis L in a direction orthogonal to the arrayed direction.

Moreover, as shown in FIG. 1, the head 3 has a board camera 17 for identifying a board mark 72a formed on a circuit board disposed on the board stage 6, and recognizing a position of the board mark 72a by the board camera 17 makes it possible to recognize a position of the circuit board 2 on the board stage 6 and a mounting position of the component 1 on the circuit board 2.

Figure 4:
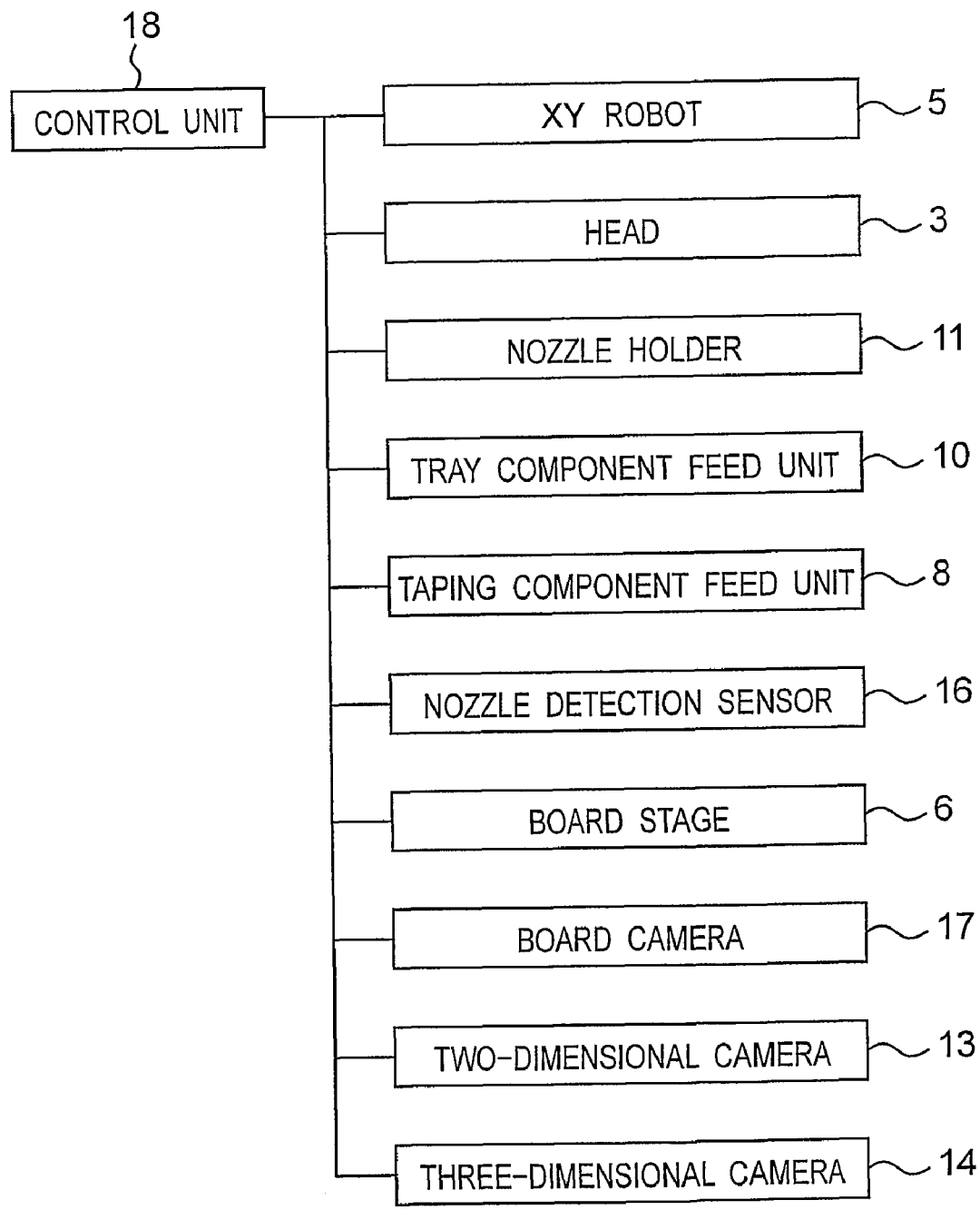
FIG. 4 is a control block diagram showing an outlined control structure in the component mounting apparatus.

Herein, FIG. 4 shows a control block showing the outlined control structure in the component mounting apparatus 100. As shown in FIG. 4, the component mounting apparatus 100 has a control unit 18 for comprehensively controlling operations of respective component sections while associating the operations with each other. The control unit can, for example, execute comprehensive control over suction nozzle checking process for determining the types of the suction nozzles 4 equipped to the respective nozzle holders 11 based on the detection result by the nozzle detection sensor 16. Moreover, information necessary for controlling the component mounting operation is inputted and stored in advance in the control unit 18, and therefore in the process of the component mounting operation, the control is executed while reference to the information is made where necessary. Such information includes information indicating which component 1 is mounted in which position on the circuit board 2 and information indicating which suction nozzle 4 in the head 3 is equipped to which nozzle holder 11 at which timing.

Figure 5:
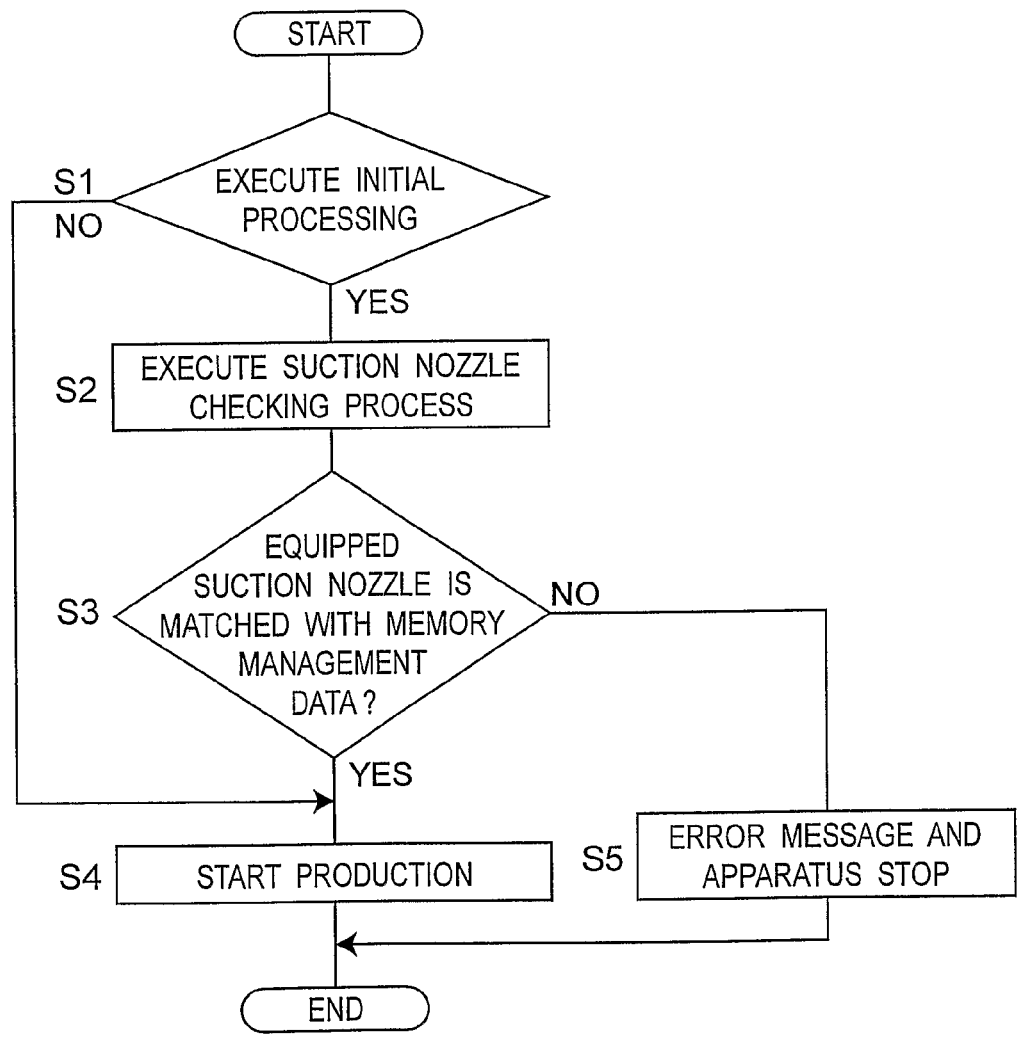
FIG. 5 is a flowchart showing the procedures for determining execution of suction nozzle checking process in the component mounting apparatus.
Figure 6:
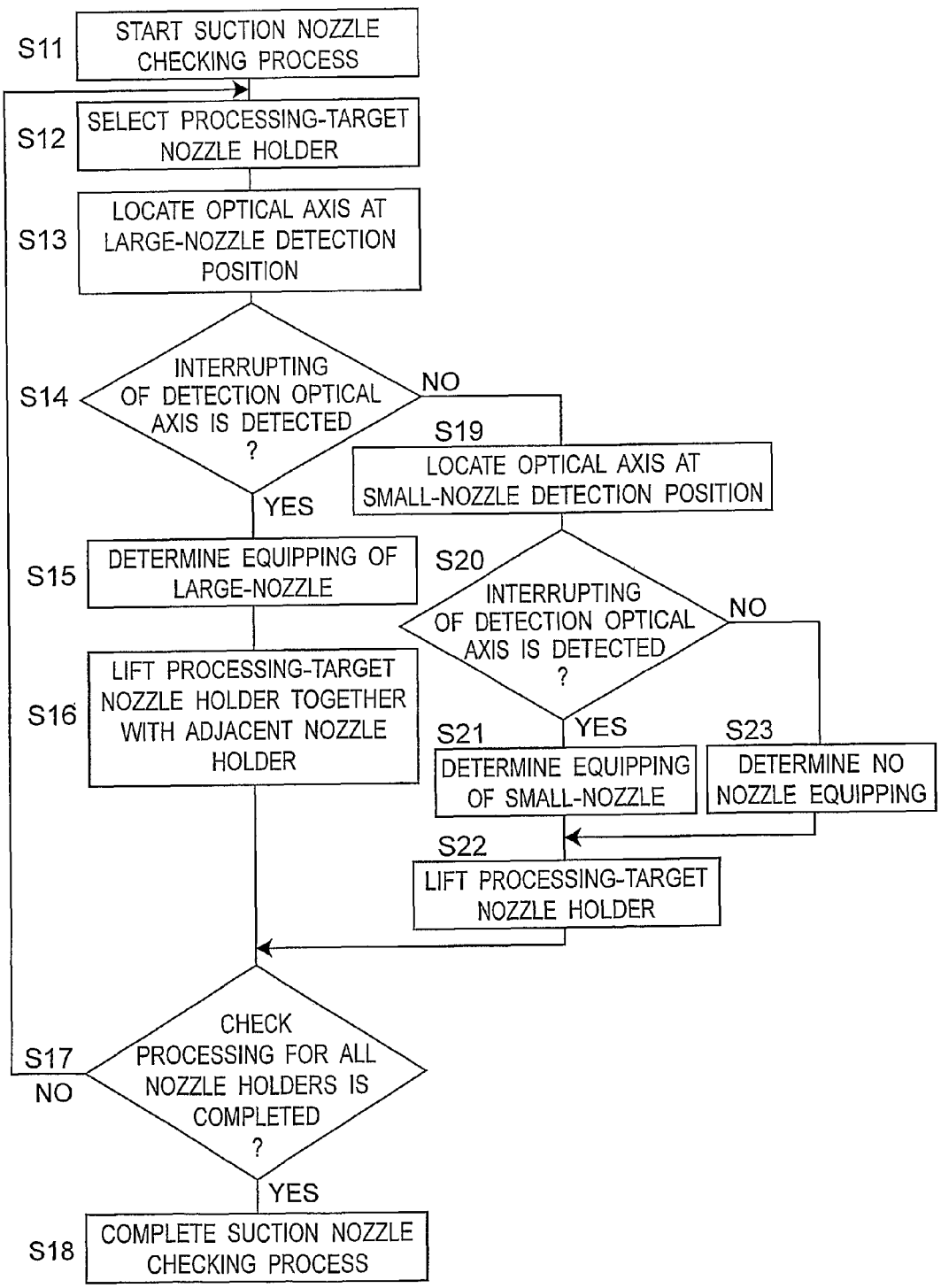
FIG. 6 is a flowchart showing the procedures for determining execution of suction nozzle checking process in the component mounting apparatus.

A description is now given of the specific procedures in executing the suction nozzle checking process in the thus-structured component mounting apparatus 100. For the description, flowcharts for showing the procedures in executing the suction nozzle checking process are shown in FIG. 5 and FIG. 6, and schematic explanatory views showing the operations of the nozzle detection sensor 16 and the head 3 for explaining the procedures in the respective flowcharts are shown in FIGS. 7A to 7C, FIGS. 8A to 8C and FIG. 9. It is to be noted that operations of respective component sections described hereinbelow are comprehensively controlled while being associated with each other by the control unit 18 included in the component mounting apparatus 100.

In the respective nozzle holders 11 in the head 3, the suction nozzle checking process for determining the presence of the equipping of the suction nozzle 4 and determining which type of suction nozzle 4, the small-nozzle 4A or the large-nozzle 4B, is the equipped suction nozzle 4 is usually executed as initial processing in the component mounting apparatus 100 in most cases. More specifically, the initial processing is executed before the component mounting operation subject to a new type of the circuit board 2 is started in the component mounting apparatus 100 (e.g., before a new program for component mounting control is inputted and component mounting operation subject to a new type of the circuit board 2 is started), or before the component mounting operation is restarted after the component mounting operation is stopped due to maintenance operation and the like. Confirming the types of the suction nozzles 4 selectively equipped to the respective nozzle holders 11 at such timing allows smooth and reliable component mounting operation and replacement operation of the suction nozzles 4 in the nozzle changing section 12 after wrong equipping of the suction nozzle 4 and the like.

First, in step S1 in the flowchart in FIG. 5, it is confirmed whether or not it is time to execute initial processing (initialization) in the component mounting apparatus 100. If it is determined that it is not yet time to execute the initial processing, component mounting operation, i.e., production operation, is started in the component mounting apparatus 100 in step S4 without execution of the suction nozzle checking process.

If it is determined that it is time to execute the initial processing in step S1, the suction nozzle checking process is executed in step S2. It is to be noted that the details of the specific processing contents will be described later in the flowchart in FIG. 6. After the suction nozzle checking process is executed, and which type of the suction nozzle 4 is equipped to which nozzle holder 11 in the head 3 is determined, the determination result is collated with memory management data (i.e., production management data indicating which suction nozzle 4 is equipped to which nozzle holder 11 at the present initial processing timing) stored in the control unit 18 in step S3 to see if the data are matched.

If it is determined based on the collation result that the data are not matched, an error message is outputted and component mounting operation in the component mounting apparatus 100 is stopped in step S5. If it is determined based on the collation result that the data are matched in step S3, component mounting operation in the component mounting apparatus 100 is started in step S4.

A description is now given of the specific details of the suction nozzle checking process for determining whether or not the processing is executed in these procedures with reference to the flowchart in FIG. 6 and schematic explanatory views in FIG. 7 to FIG. 9.

Before a description of the specific procedures proceeds, a description is first given of the respective nozzle holders 11, the suction nozzles 4 and detection positions by the nozzle detection sensor 16 in the head 3. As shown in FIG. 7A, the head 3 has nozzle holders 11 arrayed in a line. These nozzle holders 11 are referred to as a first nozzle holder 11-1, a second nozzle holder 11-2, a third nozzle holder 11-3, ... and an eighth nozzle holder 11-8 in the order from the one disposed on the right end side as viewed in the drawing. The small-nozzles 4A are equipped to the first nozzle holder 11-1, the third nozzle holder 11-3, the seventh nozzle holder 11-7 and the eighth nozzle holder 11-8, whereas the large-nozzle 4B is equipped to the fifth nozzle holder 11-5. Due to the size of the outer shape of the large-nozzle 4B, any suction nozzle 4 cannot be equipped to the fourth nozzle holder 11-4 and the sixth nozzle holder 11-6 adjacent to the fifth nozzle holder 11-5 to which the large-nozzle 4B is equipped. It is possible to equip, for example, the small-nozzle 4A to the second nozzle holder 11-2, though the suction nozzle 4 is not equipped to the second nozzle holder 11-2.

The respective nozzle holders 11 have a first detection position (i.e., a first detecting position) where interrupting of a detection optical axis L of the nozzle detection sensor 16 positioned therein is not detected when the small-nozzle 4A is equipped to the pertinent nozzle holder 11, and interrupting of the detection optical axis L by the large-nozzle 4B is detected when the large-nozzle 4B is equipped to the pertinent nozzle holder 11, and a second detection position (i.e., a second detecting position) where interrupting of the detection optical axis L by any suction nozzle 4 can be detected when the suction nozzle 4 is equipped to the pertinent nozzle holder 11. By making determination based on combination of detection results at such two detection positions, interrupting of the detection optical axis L detected, for example, at the first detection position makes it possible to determine the equipping of the large-nozzle 4B to the nozzle holder 11, while interrupting not detected at the first detection position and interrupting of the detection optical axis L detected at the second detection position make it possible to determine the equipping of the small-nozzle 4A to the nozzle holder 11. Further, interrupting detected at the second detection position makes it possible to determine that any suction nozzle 4 is equipped to the nozzle holder 11. It is to be noted that such determination is made in the control unit 18 upon input of the detection results by the nozzle detection sensor 16 into the control unit 18. In the present embodiment, the first detection position represents a large-nozzle detection position P, and the second detection position represents a small-nozzle detection position Q.

Figure 9A:
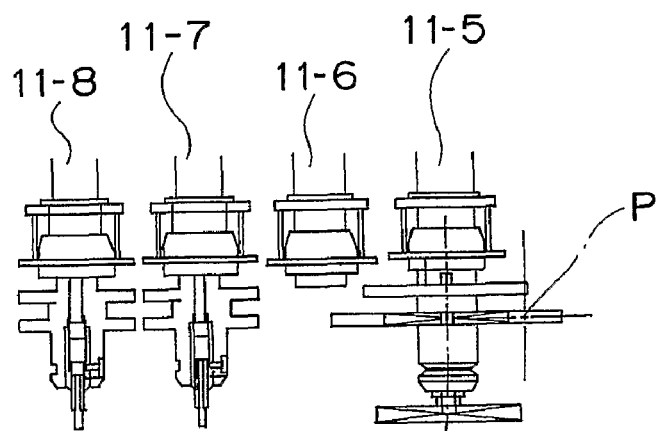

Herein, the large-nozzle detection position P and the small-nozzle detection position Q included in the respective nozzle holders 11 will be described in detail with reference to the drawings. For example, in the first nozzle holder 11-1 as shown in FIG. 7B, the small-nozzle detection position Q is positioned on the center of its axis in such a way that the detection optical axis L disposed so as to align with the small-nozzle detection position Q is interrupted if either the large-nozzle 4B or the small-nozzle 4A is equipped to the first nozzle holder 11-1. Moreover, as shown in FIG. 7A, the large-nozzle detection position P in the first nozzle holder 11-1 is positioned at a position away from the small-nozzle detection position Q, which is disposed on the center of its axis, in right-hand direction along the arrayed direction of the respective nozzle holders 11 as viewed in the drawing, the position being outside an outer edge of the small-nozzle 4A so as to prevent the detection optical axis L disposed in alignment with the large-nozzle detection position P from interfering with the small-nozzle 4A if the small-nozzle 4A is equipped, whereas for example as shown in FIG. 9A, the large-nozzle detection position P is disposed inside the outer edge of the large-nozzle 4B so that the detection optical axis L credibly interferes with the large-nozzle 4B when the large-nozzle 4B is equipped to the nozzle holder 11. It is to be noted that the detection optical axis L disposed at the large-nozzle detection position P and the large-nozzle 4B are interfered, for example, as shown in FIG. 9A, in the vicinity of an outer end section of a nozzle flange provided for component recognition. The two detection positions P and Q of the respective nozzle holders 11 are disposed at an identical height position, and are arrayed in a line along the arrayed direction of the respective nozzle holders 11.

Moreover, as shown in FIG. 7A, an array interval pitch d0 of the respective nozzle holders 11 is, for example, 21.5 mm, and an interval size d1 between the large-nozzle detection position P and the small-nozzle detection position Q in the same nozzle holder 11 is 13 mm while an interval size d2 is 8.5 mm. Moreover, the outer shape of the large-nozzle 4B (e.g., outer shape of the nozzle flange) is, for example, about 40 mm, while the outer shape of the small-nozzle 4A is, for example, about 20 mm.

It is to be noted that in the present embodiment, a photosensor is used as an example of the nozzle detection sensor 16, and such a photosensor is a relatively inexpensive sensor capable of detecting whether or not an object is positioned in the range of, for example, about 2 mm from the detection optical axis L. Accordingly, when a difference in outer shape between the large-nozzle 4B and the small-nozzle 4A is 5 mm or more, it becomes possible to sufficiently and reliably detect interrupting of the detection optical axis L while identifying the types of the respective nozzles at the large-nozzle detection position P and the small-nozzle detection position Q.

It is to be noted that the respective nozzle holders 11 have an unshown lifting and lowering device, which positions the respective nozzle holders 11 at a detection height position when detection by the nozzle detection sensor 16 is executed. For example in FIG. 7A, all the nozzle holders 11 are in the state of being lowered to the detection height position, whereas in FIG. 9B, the seventh and eighth nozzle holders 11-7, 11-8 are in the state of being positioned at the detection height position and the fifth and sixth nozzle holders 11-5, 11-6 are in the state of being lifted from the detection height position to, for example, an upper limit position in the lifting and lowering range.

More specifically, a description is now given with reference to the flowchart in FIG. 6. First, once the suction nozzle checking process is started in step S11 in FIG. 6, a nozzle holder 11 to which the suction nozzle checking process is applied first is selected in step S12. More specifically, as shown in FIG. 7A, the first nozzle holder 11-1 disposed on the right end as viewed in the drawing is selected. Then, the head 3 is moved and positioned by the XY robot 5 so that the large-nozzle detection position P in the selected first nozzle holder 11-1 is disposed on the detection optical axis L positioned between the respective transmission sensors 16a of the nozzle detection sensor 16 (step S13). It is to be noted that during this positioning, the respective nozzle holders 11 are lowered to the detection height position by the lifting and lowering device.

After the positioning as shown in FIG. 7A, the presence of interrupting of the detection optical axis L is detected by the nozzle detection sensor 16 at the large-nozzle detection position P in the first nozzle holder 11-1 positioned on the detection optical axis L (step S14). More specifically, since the small-nozzle 4A is not equipped to the first nozzle holder 11-1, interrupting of the detection optical axis L is not detected at the large-nozzle detection position P.

In such a case, in step S19, the entire head 3 is horizontally moved rightward in the arrayed direction of the respective nozzle holders 11 by an interval size d1 by the XY robot 5, by which as shown in FIG. 7B, the small-nozzle detection position Q in the first nozzle holder 11-1 is positioned on the detection optical axis L. After such positioning, the presence of the interrupting of the detection optical axis L is detected by the nozzle detection sensor 16 at the small-nozzle detection position Q in the first nozzle holder 11-1 positioned on the detection optical axis L (step S20). Since the small-nozzle 4A is equipped to the first nozzle holder 11-1, interrupting of the detection optical axis L is detected, and upon input of the detection result into the control unit 18, it is determined in the control unit 18 that the small-nozzle 4A is equipped to the first nozzle holder 11-1 (step S21). Once the detection is executed, the first nozzle holder 11-1 is lifted by the lifting and lowering device to, for example, an upper limit position in its lifting and lowering range (step S22). By this lifting operation, as shown in FIG. 7C, for example, the small-nozzle 4A equipped to the first nozzle holder 11-1 is positioned at a height position not interfering with the detection optical axis L. Thus, lifting the suction nozzle 4 equipped to the nozzle holder 11 subjected to the suction nozzle check makes it possible to credibly prevent interference between the suction nozzle 4 and component members of the component mounting apparatus 100 even if the head 3 is moved by the XY robot 5 afterward.

Next, in step S17, it is determined that the suction nozzle checking process for all the nozzle holders 11 in the head 3 is completed, and if any nozzle holder 11 which has not yet undergone the processing is present, then a next nozzle holder 11, e.g., the second nozzle holder 11-2, is selected in step S12.

Then, the entire head 3 is moved rightward as viewed in the drawing by a distance d2 so that the large-nozzle detection position P in the second nozzle holder 11-2 is positioned on the detection optical axis L (step S13). After the positioning, as shown in FIG. 8A, the presence of interrupting of the detection optical axis L at the large-nozzle detection position P is detected (step S14), and if the presence is not detected, then, as shown in FIG. 8B, the entire head 3 is moved rightward by a distance d1, so that the small-nozzle detection position Q in the second nozzle holder 11-2 is positioned on the detection optical axis L (step S19). Then, the presence of the interrupting of the detection optical axis L is detected at this position (step S20). Since the suction nozzle 4 is not equipped to the second nozzle holder 11-2, interrupting of the detection optical axis L is not detected at this position, and upon input of this detection result into the control unit 18, it is determined in the control unit 18 that the suction nozzle 4 is not equipped to the second nozzle holder 11-2 (step S23).

Then, as shown in FIG. 8C, the second nozzle holder 11-2 is lifted to an upper limit position in its lifting and lowering range by the lifting and lowering device in step S22. Further, after the lifting operation, in step S17 and S12, a next nozzle holder 11 is selected and the thus-described procedures are executed in sequence.

Figure 9B:
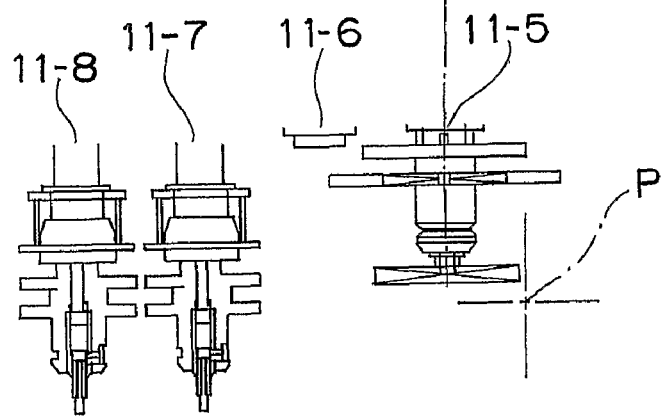
Figure 10:
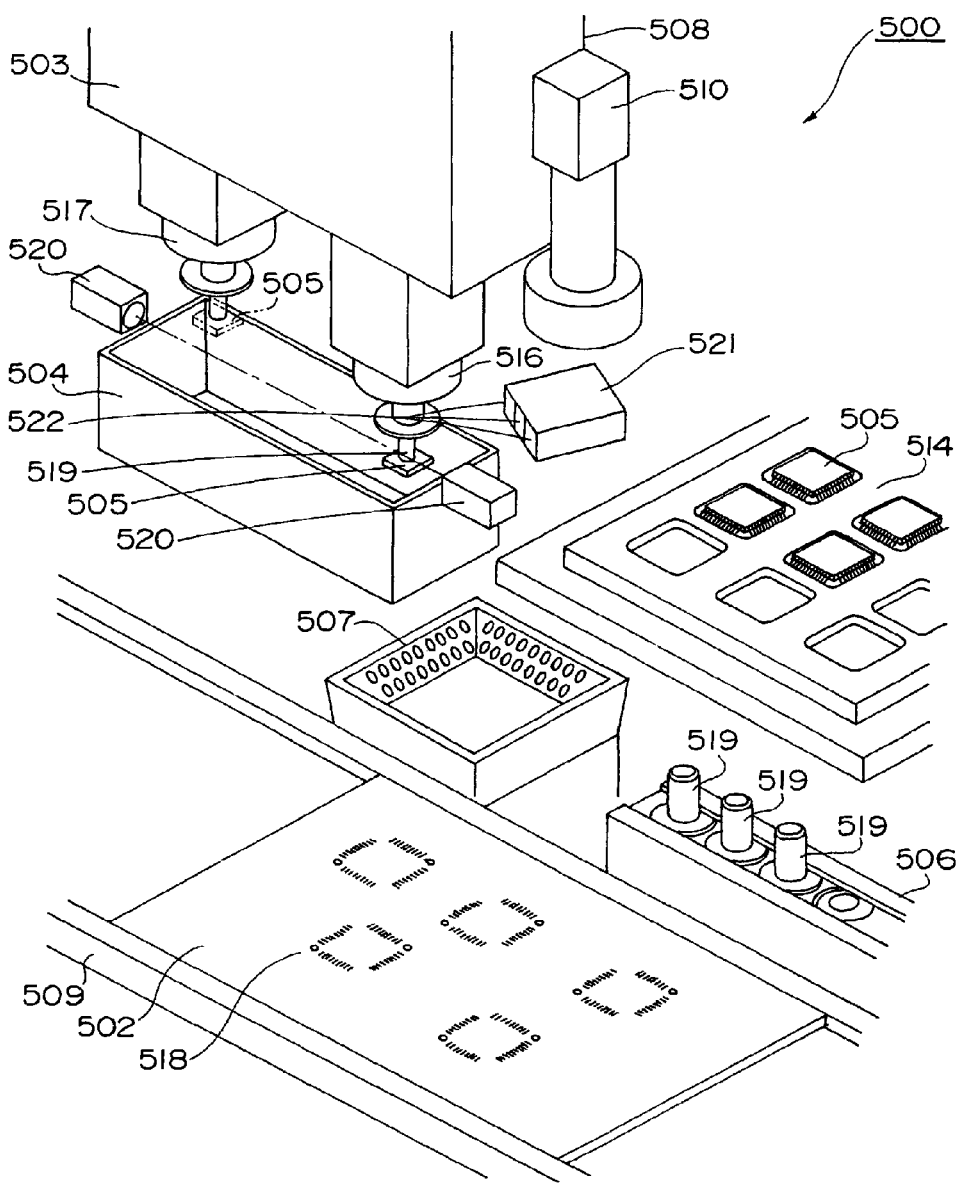
FIG. 10 is a schematic perspective view showing a sensor structure for determining the types of equipped suction nozzles in a conventional component mounting apparatus.

Then, for example, if the fifth nozzle holder 11-5 to which the large-nozzle 4B is equipped is selected in the head 3 in step S12, then interrupting of the detection optical axis L positioned at the large-nozzle detection position P (step S13) is detected in step S14 as shown in FIG. 9A. The detection result is inputted into the control unit 18, and it is determined in the control unit 18 that the large-nozzle 4B is equipped to the fifth nozzle holder 11-5 (step S15). Once the equipping of the large-nozzle 4B is determined, in lifting of the fifth nozzle holder 11-5, the sixth nozzle holder 11-6 which is a next nozzle holder 11 adjacent to the fifth nozzle holder 11-5 is also lifted as shown in FIG. 9B (step S16). This is because when the large-nozzle 4B is equipped, it is clear that the suction nozzle 4 is not equipped to the adjacent nozzle holder 11. Therefore, when it is determined in the control unit 18 that the large-nozzle 4B is equipped to the fifth nozzle holder 11-5, it is also determined that the suction nozzle 4 is not equipped to the sixth nozzle holder 11-6.

Once it is confirmed in step S17 that the suction nozzle checking process for all the nozzle holders 11 is completed by sequentially repeating such procedures, the suction nozzle checking process is completed in step S18.

According to this embodiment, the following various effects can be attained.

For determining the types of the suction nozzles 4 equipped to a plurality of the nozzle holders 11 included in the head 3, the nozzle detection sensor 16 having the detection optical axis L in a direction orthogonal to the arrayed direction of the respective nozzle holders 11 is used, and the respective nozzle holder 11 have the large-nozzle detection position P where interrupting of the detection optical axis L is detectable only when the large-nozzle 4B is equipped and the small-nozzle detection position Q where interrupting of the detection optical axis L is detectable when the suction nozzle 4 of any type is equipped, so that by sequentially positioning the detection optical axis L at the respective detection positions P and Q and detecting the presence of the interrupting, the presence of the equipping of the suction nozzle 4 and the type of the equipped suction nozzle 4 can be determined only by one sensor, i.e., the nozzle detection sensor 16. Therefore, it becomes possible to reduce costs for installing and maintaining a sensor for checking such suction nozzles 4, and to reduce equipment cost in the component mounting apparatus.

Particularly, it becomes possible to eliminate the necessity of providing conventionally used sophisticated identifying sensors, i.e., sophisticated identifying sensors for reading and recognizing the identifying marks separately put on the respective suction nozzles in order to determine the types of the component holding members, and therefore the determination can be achieved simply by a pair of the transmission sensors 16a. Moreover, since the detection optical axis L disposed between a pair of the transmission sensors 16a is disposed in a direction orthogonal to the arrayed direction of the respective nozzle holders 11, an increase in optical axis distance as seen in the conventional structure can be prevented and its adjustment operation can be facilitated.

Moreover, since a distance of the optical axis for the detection optical axis L can be shortened in the nozzle detection sensor 16 in this way, it becomes possible to facilitate the adjustment operation, and furthermore, as such a nozzle detection sensor 16, sensors having an optical axis relatively low in straight-line accuracy can be used, or an interrupting detection sensing area on the detection optical axis L (i.e., a cross-sectional area of the detection optical axis L) can be decreased, thereby allowing high-accuracy detection.

Moreover, since the respective large-nozzle detection position P and the small-nozzle detection position Q are disposed along the arrayed direction of the respective nozzle holders 11 and are also disposed at the identical height position, intermittently moving the head 3 in one direction by the XY robot 5 during the suction nozzle checking process by the nozzle detection sensor 16 makes it possible to sequentially position the respective detection positions P and Q on the detection optical axis L. This can make the detection processing efficient.

Moreover, when the suction nozzle checking process is started, all the nozzle holders 11 are lowered to the detection height position and those nozzle holders 11 with determination of the types of the suction nozzles 4 being completed are sequentially lifted to an upper limit height position in their lifting and lowering range, so that the nozzle detection sensor 16 can be disposed at the height position which prevents the nozzle detection sensor 16 from protruding from the apparatus base. This makes it possible to reliably prevent interference of the suction nozzles 4 and the nozzle holders 11 with the determination being completed with other component members of the apparatus.

Moreover, in the case where it is determined that the large-nozzle 4B is equipped to the nozzle holder 11, the nozzle holder 11 with the large-nozzle 4B equipped thereto is lifted together with an adjacent next nozzle holder 11, and it is determined without execution of the suction nozzle checking process that the suction nozzle 4 is not equipped to the next nozzle holder 11, which makes it possible to curtail a time necessary for the suction nozzle checking process and to provide more efficient processing.

It is to be noted that, by properly combining the arbitrary embodiments of the aforementioned various embodiments, the effects possessed by them can be produced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The disclosure of Japanese Patent Application No. 2005-045173 filed on Feb. 22, 2005 including specification, drawing and claims are incorporated herein by reference in its entirety.

The invention claimed is:

1. A method, for a component mounting head having holding-member equipping sections which are arrayed in a line and to each of which a first component holding member or a second component holding member having a shape different from that of the first component holding member can be replaceably and selectively equipped so as to hold a component and mount the component on a circuit board, for determining a presence of equipped first or second component holding members equipped to corresponding holding-member equipping sections, the method comprising:

determining whether an interruption of a detection optical axis of a detection sensor exists with respect to a corresponding holding-member equipping section, the interruption being caused by one of the first and second component holding members being equipped to the corresponding holding-member equipping section, by (i) positioning the component mounting head such that the corresponding holding-member equipping section is arranged at a first detecting position, or by (ii) positioning the component mounting head such that the corresponding holding-member equipping section is arranged at the first detecting position and then positioning the component mounting head such that the corresponding holding-member equipping section is arranged at a second detecting position, wherein the detection sensor is arranged such that the detection optical axis is disposed in a direction that is transverse with respect to a direction in which the holding-member equipping sections are arrayed, wherein the first detecting position is a position at which an equipped first component holding member will not interrupt the detection optical axis and at which an equipped second component holding member will interrupt the detection optical axis, and wherein the second detecting position is a position at which either an equipped first component holding member or an equipped second component holding member will interrupt the detection optical axis; and determining whether a first or second component holding member is equipped to the corresponding holding-member equipping section based on a detection result obtained from said determining of whether an interruption of the optical axis exists with respect to the corresponding holding-member equipping section.

2. The method as defined in claim 1, wherein said determining of whether a first or second component holding member is equipped to the corresponding holding-member equipping section comprises determining that the second component holding member is equipped based on a detection result that an interruption is determined to exist at the first detecting position.

3. The method as defined in claim 1, wherein said determining of whether an interruption of the optical axis exists with respect to a corresponding holding-member equipping section comprises:

positioning the component mounting head such that the corresponding holding-member equipping section is arranged at the first detecting position;

determining that no interruption of the optical axis exists at the first detecting position; and thereafter positioning the component mounting head such that the corresponding holding-member equipping section is arranged at the second detecting position, and wherein said determining of whether a first or second component holding member is equipped to the corresponding holding-member equipping section comprises determining that the first component holding member is equipped based on a detection result that an interruption is determined to exist at the second detecting position.

4. The method as defined in claim 1, wherein said determining of whether an interruption of the optical axis exists with respect to a corresponding holding-member equipping section comprises:
positioning the component mounting head such that the corresponding holding-member equipping section is arranged at the first detecting position;
determining that no interruption of the optical axis exists at the first detecting position; and thereafter
positioning the component mounting head such that the corresponding holding-member equipping section is arranged at the second detecting position,
and wherein said determining of whether a first or second component holding member is equipped to the corresponding holding-member equipping section comprises determining that neither of the first and second component holding members is equipped based on a detection result that no interruption is determined to exist at the second detecting position.

5. The method as defined in claim 1, further comprising:
after said determining of whether a first or second component holding member is equipped to the corresponding holding-member equipping section, lifting the corresponding holding-member equipping section.

6. The method as defined in claim 5, wherein the holding-member equipping sections are arrayed at constant intervals, the shape of each of the first component holding members each having an outer dimension such that that the constant intervals are used as equipping intervals of the first component holding members, the shape of each of the second component holding members having an outer dimension twice that of the constant intervals, the outer dimension twice that of the constant intervals being used as equipping intervals of the second component holding members,
wherein said determining of whether a first or second component holding member is equipped to the corresponding holding-member equipping section comprises determining that the second component holding member is equipped to the corresponding holding-member equipping section, and
wherein said lifting of the corresponding holding-member equipping section comprises lifting the corresponding holding-member equipping section together with an adjacent holding-member equipping section.

7. The method as defined in claim 1, wherein said determining of whether a first or second component holding member is equipped to the corresponding holding-member equipping section comprises:
determining that a component holding member is equipped to the corresponding holding-member equipping section; and
identifying the equipped component holding member as a first component holding member or a second component holding member,
wherein said determining that a component holding member is equipped and said identifying of the equipped component holding member are based only on a detection result obtained from said determining of whether an interruption of the optical axis exists with respect to the corresponding holding-member equipping section.

* * * * *